(12) United States Patent
Banijamali

(10) Patent No.: US 8,742,477 B1
(45) Date of Patent: Jun. 3, 2014

(54) ELLIPTICAL THROUGH SILICON VIAS FOR ACTIVE INTERPOSERS

(75) Inventor: Bahareh Banijamali, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 399 days.

(21) Appl. No.: 12/961,376

(22) Filed: Dec. 6, 2010

(51) Int. Cl.
*H01L 23/48* (2006.01)
*H01L 21/70* (2006.01)
*H01L 29/40* (2006.01)

(52) U.S. Cl.
USPC .............. 257/276; 257/502; 257/621

(58) Field of Classification Search
USPC .......................... 257/276, 502, 621
See application file for complete search history.

(56) References Cited

U.S. PATENT DOCUMENTS

| | | | | |
|---|---|---|---|---|
| 6,037,547 A * | 3/2000 | Blish, II | ............ | 174/264 |
| 6,268,568 B1 * | 7/2001 | Kim | ............ | 174/250 |
| 6,774,474 B1 * | 8/2004 | Caletka et al. | ............ | 257/686 |
| 7,355,267 B2 * | 4/2008 | Kirby et al. | ............ | 257/621 |
| 7,390,749 B2 * | 6/2008 | Kim et al. | ............ | 438/702 |
| 7,427,803 B2 * | 9/2008 | Chao et al. | ............ | 257/659 |
| 7,521,807 B2 * | 4/2009 | Shizuno | ............ | 257/774 |
| 7,947,536 B2 * | 5/2011 | Coe et al. | ............ | 438/127 |
| 8,008,786 B2 * | 8/2011 | Pham et al. | ............ | 257/786 |
| 8,030,780 B2 * | 10/2011 | Kirby et al. | ............ | 257/774 |
| 8,047,421 B2 * | 11/2011 | Sri-Jayantha et al. | ... | 228/180.21 |
| 8,125,064 B1 * | 2/2012 | Lee et al. | ............ | 257/684 |
| 8,159,060 B2 * | 4/2012 | Barth et al. | ............ | 257/686 |
| 8,178,392 B2 * | 5/2012 | Choi et al. | ............ | 438/108 |
| 8,237,285 B2 * | 8/2012 | Tanida et al. | ............ | 257/774 |
| 8,304,863 B2 * | 11/2012 | Filippi et al. | ............ | 257/621 |
| 2001/0044175 A1 * | 11/2001 | Barrett et al. | ............ | 438/224 |
| 2003/0054635 A1 * | 3/2003 | Egitto et al. | ............ | 438/678 |
| 2004/0224148 A1 * | 11/2004 | Matsunaga | ............ | 428/332 |
| 2006/0046475 A1 * | 3/2006 | Wark et al. | ............ | 438/667 |
| 2007/0045857 A1 * | 3/2007 | Wark et al. | ............ | 257/773 |
| 2007/0169959 A1 * | 7/2007 | Ding et al. | ............ | 174/260 |
| 2009/0001396 A1 * | 1/2009 | Higaki et al. | ............ | 257/98 |
| 2009/0121338 A1 * | 5/2009 | Seng | ............ | 257/686 |
| 2009/0130846 A1 * | 5/2009 | Mistuhashi | ............ | 438/667 |
| 2010/0090317 A1 * | 4/2010 | Zimmermann et al. | ...... | 257/621 |
| 2010/0258918 A1 * | 10/2010 | Matsui et al. | ............ | 257/621 |
| 2010/0261313 A1 * | 10/2010 | Toh et al. | ............ | 438/109 |
| 2010/0264542 A1 * | 10/2010 | Pham et al. | ............ | 257/738 |
| 2011/0031599 A1 * | 2/2011 | Jo | ............ | 257/686 |
| 2011/0056740 A1 * | 3/2011 | Takano | ............ | 174/262 |
| 2012/0119374 A1 * | 5/2012 | Rahman et al. | ............ | 257/774 |
| 2012/0152348 A1 * | 6/2012 | Miura | ............ | 136/256 |

OTHER PUBLICATIONS

Roychowdhury, S. K. et al., "Module 3 Design for Strength, Lesson 2 Stress Concentration" *Design of Machine Elements I (Web Course*, Version 2 ME, downloaded Jul. 8, 2010 from <http://npter.iitm.ac.in/courses/Webcourse-contents/IIT%20Kharagpur/Machine%20design1/pdf/Module-3_lesson-2.pdf>, pp. 1-15, National Programme on Technology Enhanced Learning (NPTEL), IIT Madras, Chennai, India.

* cited by examiner

*Primary Examiner* — James Mitchell
(74) *Attorney, Agent, or Firm* — Kevin T. Cuenot; Lois D. Cartier

(57) ABSTRACT

An integrated circuit structure can include a silicon interposer. The silicon interposer can include a first elliptical TSV and a keep out zone (KOZ) for stress effects upon active devices surrounding the first elliptical TSV. A size of the KOZ can be determined by a transverse diameter and a conjugate diameter of the first elliptical TSV.

19 Claims, 3 Drawing Sheets

ELLIPTICAL THROUGH SILICON VIAS FOR ACTIVE INTERPOSERS

FIELD OF THE INVENTION

One or more embodiments disclosed within this specification relate to integrated circuits (ICs). More particularly, one or more embodiments relate to an elliptical through silicon via for use within an IC silicon interposer.

BACKGROUND

In general, the probability that a manufacturing flaw or "fault" will occur within an IC increases as the size of the die used to implement that IC increases. The occurrence of a manufacturing fault within an IC can result in a reduction, or a complete failure, in the operability of the IC. For this reason, it can be more cost effective to divide the circuits to be implemented within the IC across multiple dies. With a multi-die approach, a manufacturing fault occurring on any one of the dies renders only that individual die inoperable and not the entire IC. By implementing the IC using multiple dies as opposed to a single larger die, less die area of the IC becomes unusable when a manufacturing fault renders one of the dies inoperable.

Using a multi-die approach, ICs can be implemented with multiple dies placed within a single package. Implementing an IC with multiple dies requires a partitioning of circuits of the IC among two or more dies. Partitioning circuits of the IC among multiple dies results in the creation of one or more inter-die signals. In order to pass these inter-die signals between dies, each die can be mounted upon a silicon interposer that includes conductive interconnect material that can electrically couple the two or more dies. The interposer can be mounted within a single IC package. In order to couple each die to the IC package, through silicon vias (TSVs) can be implemented within the silicon interposer. Each TSV creates a vertical conductive path from a coupling point on a die, through the interposer, to a coupling point within the IC package or a node external to the package. Through a TSV, the die can be coupled to a signal or power supply external to the IC package.

SUMMARY

One or more embodiments disclosed within this specification relate to integrated circuits (ICs) and, more particularly, to elliptical shaped through silicon vias (TSVs).

An embodiment can include an IC structure. The IC structure can include a silicon interposer including a first elliptical shaped TSV and a keep out zone (KOZ). The KOZ can surround the first elliptical TSV. The KOZ can be devoid of active devices and have a size that is determined by a transverse diameter and a conjugate diameter of the first elliptical TSV.

The silicon interposer can include an active device located external to the KOZ.

In one aspect, the silicon interposer can include a second elliptical TSV having a major axis aligned with a major axis of the first elliptical TSV. In another aspect, the silicon interposer can include a second elliptical TSV, wherein a transverse diameter of the second elliptical TSV is larger than the transverse diameter of the first elliptical TSV. In another aspect, the silicon interposer can include a second elliptical TSV, wherein a conjugate diameter of the second elliptical TSV is larger than the conjugate diameter of the first elliptical TSV. In still another aspect, the silicon interposer can include a second elliptical TSV, wherein an orientation of a major axis of the second elliptical TSV differs from an orientation of a major axis of the first elliptical TSV.

The silicon interposer can include a first plurality of elliptical TSVs including the first TSV aligned in a first column, wherein a major axis of each of the first plurality of elliptical TSVs is aligned with a first common axis. The silicon interposer also can include a second plurality of elliptical TSVs aligned in a second column, wherein a major axis of each of the second plurality of elliptical TSVs is aligned with a second common axis. The second column of elliptical TSVs can be a predetermined distance from, and substantially parallel to, the first column of elliptical TSVs.

The silicon interposer can include at least one active device located between the first and the second columns of elliptical TSVs. For example, the active device can be located within a column that is a first predetermined distance from the first column of elliptical TSVs and a second predetermined distance from the second column of elliptical TSVs.

In one aspect, the predetermined distance between the first and the second columns of elliptical TSVs can be greater than a sum of one half of a width of each KOZ surrounding the first and second columns of elliptical TSVs. The width of each KOZ for each of the first and second columns of elliptical TSVs can be determined according to a conjugate diameter of at least one of the plurality of elliptical TSVs within each respective column of elliptical TSVs.

Another embodiment can include an IC structure that includes a silicon interposer having a first plurality of elliptical TSVs aligned in a first column and a second plurality of elliptical TSVs aligned in a second column. A major axis of each of the first plurality of elliptical TSVs can be aligned with a first common axis. A major axis of each of the second plurality of elliptical TSVs can be aligned with a second common axis. The second column of elliptical TSVs can be a predetermined distance from, and substantially parallel to, the first column of elliptical TSVs.

The silicon interposer can include at least one active device located between the first and the second columns of elliptical TSVs. For example, the active device can be located in a column of a predetermined width between the first and the second columns of elliptical TSVs.

The predetermined distance between the first and the second plurality of elliptical TSVs can be greater than a sum of one half of a width of each KOZ for stress effects upon active devices surrounding the first and second columns of elliptical TSVs. The width of the KOZ for each of the first and second columns of elliptical TSVs can be determined by a conjugate diameter of at least one the plurality of elliptical TSVs within each respective column of elliptical TSVs.

In one aspect, the silicon interposer can include a first elliptical TSV of either the first or the second plurality of elliptical TSVs and a second elliptical TSV of either the first or the second plurality of elliptical TSVs, wherein a transverse diameter of the second elliptical TSV is larger than a transverse diameter of the first elliptical TSV.

In another aspect, the silicon interposer can include a first elliptical TSV of either the first or the second plurality of elliptical TSVs and a second elliptical TSV of either the first or the second plurality of elliptical TSVs, wherein a conjugate diameter of the second elliptical TSV is larger than a conjugate diameter of the first elliptical TSV.

In still another aspect, the silicon interposer can include an elliptical TSV, not of the first or second plurality of elliptical TSVs, wherein an orientation of a major axis of the elliptical TSV differs from an orientation of the first and second common axes.

The silicon interposer also can include a third plurality of elliptical TSVs in a third column within the silicon interposer, wherein a major axis of each of the third plurality of elliptical TSVs is aligned with a third common axis, and wherein an orientation of the third common axis differs from an orientation of the first and second common axes.

Another embodiment can include an IC structure including an active silicon interposer having an elliptical shaped opening that extends through the active silicon interposer from a first planar surface of the active silicon interposer to a second planar surface of the active silicon interposer substantially perpendicular to both planar surfaces. The IC structure further can include a conductive material within the elliptical shaped opening forming a conductive pathway extending from the first planar surface through to the second planar surface.

The elliptical shaped opening can be located a predetermined distance from an active device located outside of a keep out zone (KOZ) associated with stress effects upon active devices. The size of the KOZ can be determined by a transverse diameter and a conjugate diameter of the elliptical shaped opening.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to an elliptical through silicon via (TSV) for use within an IC silicon interposer. In accordance with the embodiments disclosed within this specification, a multi-die IC silicon interposer can be implemented with elliptical shaped TSVs. Implementing a TSV in an elliptical shape can reduce the distance stress effects that migrate outward from the minor axis of the elliptical TSV as compared to a circular TSV. The elliptical shape reduces the width of a keep out zone (KOZ) for active devices surrounding the TSV along the minor axis. By locating active devices within the silicon interposer parallel to a major axis of an elliptical TSV, e.g., within a column parallel to the major axis, the active devices can be located closer to the elliptical TSV than is possible with a circular TSV.

A silicon interposer can be implemented with one or more columns of elliptical TSVs. The major axis of each TSV in a column can be aligned. The columns of TSVs can be spaced to allow active devices to be located between the columns, but outside of the KOZ for each column of TSVs. Using this approach increases the area available within the silicon interposer for active devices when compared to a silicon interposer implemented with circular TSVs.

Figure 1:
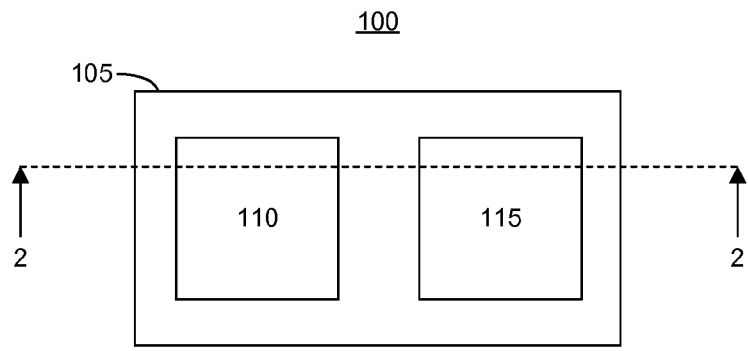
FIG. 1 is a first block diagram illustrating a topographic view of a multi-die integrated circuit (IC) silicon interposer structure in accordance an embodiment disclosed within this specification.

FIG. 1 is a first block diagram illustrating a topographic view of a multi-die IC silicon interposer structure (structure) 100 in accordance with an embodiment disclosed within this specification. In one aspect, structure 100 illustrates a packing approach to stacking multiple dies of an IC within a single package. Structure 100 can include a silicon interposer (interposer) 105, die 110, and die 115.

Interposer 105 can have a planar surface on which dies 105 and 110 can be horizontally stacked. As shown, dies 105 and 110 can be located on the planar surface of interposer 105 side-by-side. Although implemented with two horizontally stacked dies within FIG. 1, structure 100 also can be implemented with more than two dies being horizontally stacked. In another embodiment, die 115 can be stacked vertically on top of die 110. In still another embodiment, interposer 105 can be used as an intermediate layer between two vertically stacked dies. In that case, interposer 105 can isolate vertically stacked dies from one another within a multi-die IC package.

Interposer 105 can provide a common mounting surface and electrical coupling point for two or more dies of a multi-die IC. Interposer 105 can serve as an intermediate layer for interconnect routing between dies or as a ground or power plane for the multi-die IC. Interposer 105 can be implemented with a silicon wafer substrate, whether doped or un-doped with an N-type and/or a P-type impurity. The manufacturing of interposer 105 can include one or more additional process steps that allow the deposition of one or more layer(s) of metal interconnect. These metal interconnect layers can include aluminum, gold, copper, nickel, various silicides, and/or the like.

Interposer 105 can be manufactured using one or more additional process steps that allow the deposition of one or more dielectric or insulating layer(s) such as, for example, silicon dioxide. In addition, interposer 105 can be manufactured using one or more additional process steps that allow the creation of active devices such as, for example, transistor devices, within interposer 105.

Figure 2:
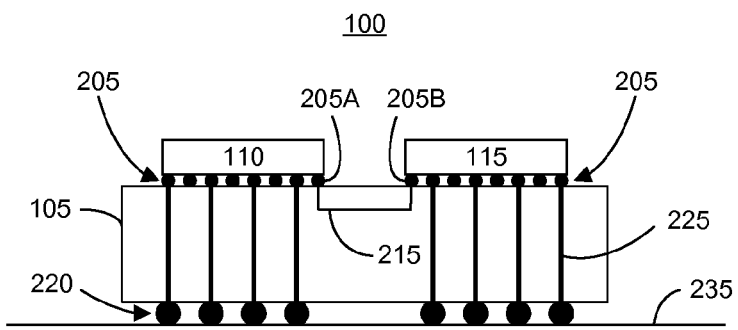
FIG. 2 is a second block diagram illustrating a cross-sectional side view of a multi-die IC silicon interposer structure in accordance with another embodiment disclosed within this specification.

FIG. 2 is a second block diagram illustrating a cross-sectional side view of a multi-die IC silicon interposer structure in accordance with another embodiment disclosed within this specification. More particularly, FIG. 2 illustrates a view of structure 100 of FIG. 1 taken along cut-line 2. As such, like numbers will be used to refer to the same items throughout this specification to the extent possible.

Referring to FIG. 2, each of dies 110 and 115 can be electrically coupled to interposer 105 via solder bumps 205.

In addition, each of solder bumps 205 can serve to physically attach dies 110 and 115 to interposer 105. Through solder bumps 205, for example, interposer 105 is coupled to die 110. Similarly, through solder bumps 205, die 110 is coupled to interposer 105.

Although the coupling of dies 110 and 115 to interposer 105 is accomplished through solder bumps 205, a variety of other approaches can be used to couple interposer 105 to dies 110 and 115. For example, bond wires or edge wires can be used to couple dies of a multi-die IC to an underlying interposer. In another example, an adhesive material can be used to physically attach dies 110 and 115 to interposer 105. As such, the coupling of dies 110 and 115 to interposer 105 via solder bumps 205, as illustrated within FIG. 2, is provided for purposes of illustration and is not intended to limit the one or more embodiments disclosed within this specification.

Interconnect material within interposer 105 can be used to pass inter-die signals between dies 110 and 115. For example, interconnect 215 can be coupled to each of solder bumps 205A and 205B to couple die 110 to die 115, thereby allowing the exchange of inter-die signals between dies 110 and 115. In addition, interposer 105 can be implemented with multiple conductive layers that can be coupled together with vias (not shown). In that case, interconnect 215 can be implemented within two or more conductive layers coupled together using vias within interposer 105. The use of multiple conductive layers to implement interconnects within interposer 105 allows a greater number of signals to be routed and more complex routing of signals to be achieved within interposer 105.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Solder bumps 220 can be used to electrically couple structure 100 to a surface 235. Surface 235 can represent, for example, a multi-die IC package in which structure 100 is implemented. Solder bumps 220 further can couple structure 100 directly to a node external to the multi-die IC package. For example, solder bumps 220 can be used to physically attach interposer 105 to surface 235. TSVs 225 represent elliptical shaped vias that, when filled with conductive material, form an electrical connection that vertically transverses, e.g., extends through, interposer 105.

TSVs 225 can be implemented by drilling or etching an opening into interposer 105 that extends from a first planar surface, i.e., the surface to which solder bumps 205 are coupled, through to a second planar surface, i.e., the surface to which solder bumps 220 are coupled. Conductive material then can be deposited within TSVs 225. Examples of conductive material that can be used to fill TSVs 225 can include, but is not limited to, copper, aluminum, gold, copper, nickel, various silicides, and/or the like.

TSVs 225, in combination with solder bumps 220, couple die 110 to surface 235. As noted, one or more additional process steps can be used to implement active devices within interposer 105. Generally with multi-die ICs, large sections of the silicon interposer, including portions surrounding interconnect and TSVs, remain unused. In accordance with one or more embodiments disclosed within this specification, active devices such as transistors can be implemented within unused portions of the interposer.

Thus, as shown within FIG. 2, the first planar surface of interposer 105 can be physically coupled to dies 110 and 115. The second planar surface of interposer 105 can be physically coupled to surface 235. Each of dies 110 and 115 and surface 235 can be implemented using materials that can have differing coefficients of thermal expansion as compared to interposer 105. As a result, each of interposer 105, dies 110 and 115, and surface 235 can expand at differing rates when exposed to changes in temperature.

When implemented within a system, an IC package that includes interposer 105, dies 110 and 115, and surface 235, can be affected by changes in temperature external to the IC package. In addition, in a powered up state, devices within structure 100 can generate heat that can alter the temperature of interposer 105, dies 110 and 115, and surface 235. The constant changes in temperature can result in the continual expansion and contraction of each of interposer 105, dies 110 and 115, and surface 235.

As each of dies 110 and 115 and surface 235 can have a different coefficient of thermal expansion than interposer 105, each can expand and contract at a different rate than interposer 105. With each of dies 110 and 115 and surface 235 being physically coupled to interposer 105, the different rates of expansion and contraction between interposer 105, dies 110 and 115, and surface 235 result in the application of forces to the respective components. These forces can create stress within interposer 105 that can increase in areas surrounding openings through interposer 105, such as TSVs 225.

In addition, the conductive material used to fill TSVs 225 can have a different coefficient of thermal expansion than interposer 105. In that case, the conductive material used to fill each TSV 225 can expand and contract at a different rate than interposer 105. As a result, the conductive material can exert an additional force on interposer 105 from within the TSVs 225, thereby further increasing the stress applied to areas of interposer 105 surrounding TSVs 225.

Figure 3:
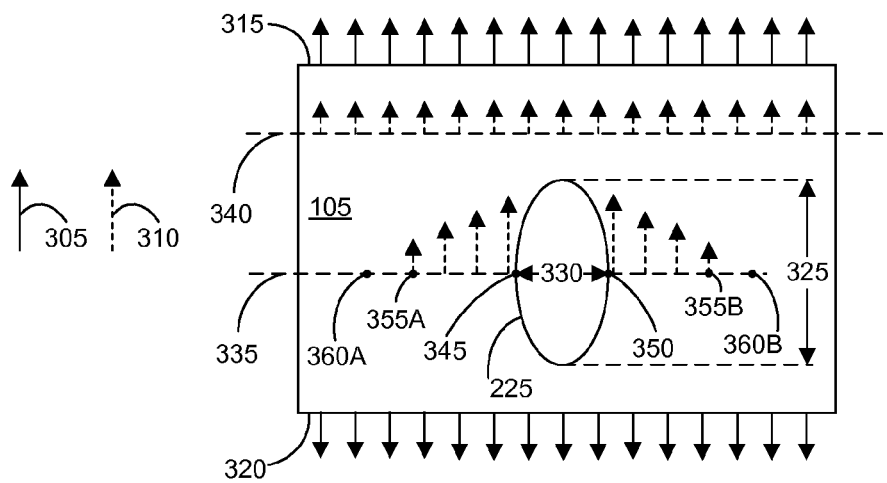
FIG. 3 is a third block diagram illustrating the effects of stress within a multi-die IC silicon interposer surrounding an elliptical through silicon via (TSV) in accordance with another embodiment disclosed within this specification.

FIG. 3 is a third block diagram illustrating the effects of stress within a multi-die IC silicon interposer surrounding an elliptical TSV in accordance with another embodiment disclosed within this specification. More particularly, FIG. 3 illustrates the manner in which forces applied to a multi-die IC silicon interposer, such as interposer 105, can result in the application of stress. FIG. 3 illustrates the manner in which stress is concentrated in the area surrounding an elliptical TSV such as TSV 225.

As previously described, physical coupling of interposer 105 to one or more dies and IC packaging can result in the application of forces to interposer 105. The conductive material within TSV 225 also can result in the application of forces to interposer 105. The forces can create stress within the material used to implement interposer 105. This stress is increased in and around areas of interposer 105 that surround any opening through interposer 105, such as TSV 225.

To better illustrate how forces generate stress within interposer 105, FIG. 3 depicts a one-dimensional case in which a uni-axial force is applied to interposer 105. In actuality, three-dimensional forces can be applied to interposer 105 that can be oriented along, or between, three orthogonal axes defining the positioning of interposer 105. It should be appreciated that FIG. 3 is not drawn to scale. FIG. 3 is drawn to more clearly illustrate the forces surrounding a TSV such as TSV 225.

Referring to FIG. 3, a uni-axial force is applied to interposer 105 along edges 315 and 320. The application of force to interposer 105 generates tensile stress within the material used to implement interposer 105. The force applied to an area of an edge of interposer 105 is illustrated by each of arrows 305. Tensile stress present within interposer 105 is illustrated by each of arrows 310. The orientation and length of each of arrows 305 demonstrate the direction and magnitude, respectively, of the force applied to edges 315 and 320 of interposer 105. Similarly, the orientation and length of each of arrows 310 demonstrate the direction and magnitude, respectively, of the stress generated within various areas of interposer 105.

When force is applied to interposer 105, any discontinuity in the material, e.g., TSV 225, affects the stress concentration in areas surrounding the discontinuity. As a result, TSV 225 increases stress in areas of interposer 105 surrounding TSV 225. Referring to FIG. 3, TSV 225 is implemented as an elliptical opening filled with a conductive material. An ellipse is a smooth, closed curve that is symmetric about the horizontal and vertical axes of the ellipse. The distance between antipodal points on the ellipse is at a maximum along a major axis and at a minimum along a perpendicular minor axis. In general, antipodal points can refer to a pair of points on the perimeter of the ellipse that can be connected by a line having a midpoint located at the center of the ellipse. A transverse diameter (diameter) 325 can be defined as a diameter of the ellipse along the major axis. A conjugate diameter (diameter) 330 can be defined as a diameter of the ellipse along the minor axis.

The stress created by the presence of TSV 225 within interposer 105 is generally concentrated at the edge of the opening for TSV 225 and decreases along line 335 when moving away from TSV 225. In other words, stress is maximized within interposer 105 along an axis symmetrically bisecting TSV 225 perpendicular to the direction of the force applied to interposer 105, i.e., in this case along diameter 330. In general, in areas of interposer 105 parallel to, but above or below diameter 330, stress is distributed in a normalized fashion. For example, the magnitude of the stress concentration along line 340 within interposer 105 has returned to a normalized and evenly distributed stress concentration.

The tensile stress concentration at points 345 and 350 along an edge of TSV 225 can be described by the expression $\sigma 3=\sigma 1(1+2b/a)$. Within the expression for $\sigma 3$, $\sigma 1$ represents the uniform, or average, tensile stress within interposer 105, for example, along line 340. The variable a is the radius of TSV 225 that is parallel to the direction of the force. The variable b is the radius of TSV 225 that is perpendicular to the direction of the force. In the example, illustrated in FIG. 3, a is equal to one half the transverse diameter 325 of TSV 225 and b is equal to one half the conjugate diameter 330 of TSV 225. The expression for $\sigma 3$ demonstrates that the tensile stress concentration at points 345 and 350, i.e., $\sigma 3$, can be decreased by increasing the length of a relative to the length of b. The phrase "stress concentration factor," generally denoted as $K_t$, can be defined as $K_t=\sigma 3/\sigma 1$.

In the case of circular, or substantially circular TSVs, the length of a is approximately equal to the length of b. Accordingly, the expression can be rewritten as $\sigma 3=3\sigma 1$ and $K_t=3$. Unlike circular TSVs, TSV 225 is formed as an elliptical opening in which the major axis of TSV 225 is parallel to the force applied to interposer 105 and the minor axis of TSV 225 is perpendicular to the applied force to interposer 105. Orienting and shaping TSV 225 as described with reference to FIG. 3 effectively reduces the value of $K_t$ at points 345 and 350 of TSV 225. For example, assume TSV 225 is structured such that the ratio a:b is approximately 2:1. In that case, $\sigma 3=2\sigma 1$ and $K_t=2$ rather than three in the case of a circular TSV.

In addition to reducing $K_t$ at points 345 and 350, using an elliptical shape for TSV 225 reduces the zone, e.g., the distance from TSV 225 along line 335, in which the stress concentration is greater than the uniform tensile stress, i.e., $\sigma 1$. The presence of increased stress within interposer 105 can affect the performance of active devices implemented within interposer 105. For example, stress can cause variations in carrier mobility within active devices within interposer 105. Considering that stress concentration is greater within interposer 105 in the areas surrounding TSV 225 along line 335, the performance of active devices located along line 335 can vary as a consequence of the increased stress concentration introduced by TSV 225.

For this reason, a KOZ is typically designated that defines a particular area within an interposer surrounding a TSV in which active devices are not to be located in order to avoid stress related performance issues with the active devices. When TSV 225 is implemented in the form of an ellipse, the KOZ surrounding TSV 225 can be narrower along line 335 relative to a circular TSV implemented at the same location as TSV 225, e.g., having a same center point as TSV 225. For example, the KOZ of TSV 225 can extend outward from TSV 225 along line 335 to points 355A and 355B. A KOZ for a circular TSV, however, would extend beyond point 355, for example, to points 360A and 360B. The elliptical shape of TSV 225 allows active devices to be located closer to TSV 225 along line 335 than is possible with a circular TSV without suffering stress related performance issues.

Figure 4:
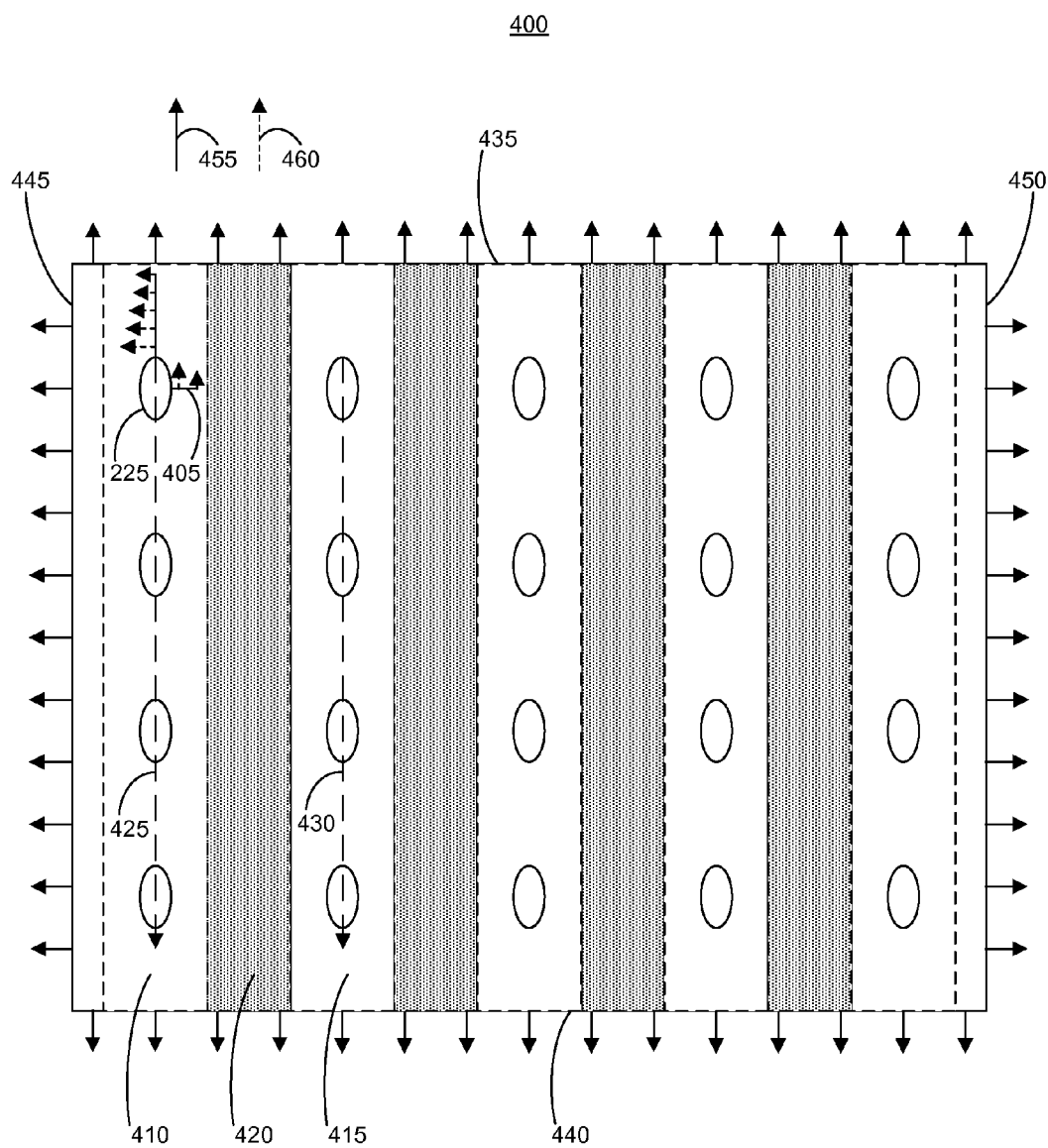
FIG. 4 is a fourth block diagram illustrating a topographic view of a multi-die silicon interposer in accordance with another embodiment disclosed within this specification.

FIG. 4 is a fourth block diagram illustrating a topographic view of a multi-die IC silicon interposer 400 in accordance with another embodiment disclosed within this specification. FIG. 4 illustrates an active interposer structure that leverages the use of columns of like oriented elliptical TSVs in order to decrease the size of KOZs within interposer 400 and increase available space for implementing active devices within interposer 400. Interposer 400 can include KOZs 410 and 415 as well as active device area 420.

Within each of KOZs 410 and 415, two or more TSVs are aligned such that the major axis of each TSV lies along a same axis. For example, TSVs located within KOZ 410 are aligned along axis 425 and TSVs located within KOZ 415 are aligned along axis 430. It should be noted that although each TSV within each column of TSVs in interposer 400 can be implemented with a same, or substantially similar, size, each TSV within a column can be implemented with a different transverse diameter and/or conjugate diameter as long as the major axis of each TSV in the column is aligned along a common axis. As such, the use of a common opening size for each TSV within interposer 400 in FIG. 4 is for clarity of description and is not intended to limit the one or more embodiments disclosed within this specification.

In the example shown in FIG. 4, a width of each of KOZs 410 and 415 is determined by the conjugate diameters of the TSVs along axes 425 and 430, respectively. In an embodiment, the width of each of KOZ 410 and KOZ 415 need not be the same. In that case, the conjugate diameter of the TSVs within KOZ 410 can differ from the conjugate diameter of the TSVs within KOZ 415. Thus, each of KOZs 410 and 415 can differ in sizing according to the elliptical shape of the TSVs within the KOZ. In another embodiment, the transverse diameter and/or conjugate diameter of one or more TSVs within a column can differ from other TSVs within the column in either of KOZs 410 or 415. In that case, the edges of the KOZ neighboring a column of TSVs with differing diameter(s) would not be straight lines, but rather follow a contour defined by each of the individual TSVs in the column.

Force arrows 455 illustrate that interposer 400 is experiencing two sets of opposing forces along two orthogonal axes. The first set of opposing forces appears along edges 435 and 440. The second set of opposing forces appears along edges 445 and 450. These two sets of opposing forces create stress within interposer 400 that is illustrated with arrows 460. The stress within interposer 400 is concentrated in areas of interposer 400 surrounding each TSV.

In illustration, consider the case of TSV 225 and the stress concentration occurring in an area of interposer 400 surrounding TSV 225. The set of opposing forces applied along edges 435 and 440 generates a concentration of stress along line 405. As the conjugate diameter of elliptical TSV 225 is perpendicular to the opposing forces applied along edges 435 and 440, the stress concentration along line 455 created by TSV 225 is less than the stress that would be caused by a circular TSV. Further, the stress falls off, e.g., decreases, more rapidly moving away from TSV 225 along line 405 than is the case for a circular TSV. In this regard, higher stresses do not propagate as far away from TSV 225 as is the case with a circular TSV.

The reduction in stress concentration along line 405 resulting from using elliptical TSV 225 allows active devices to be located closer to TSV 225 than is possible with a circular TSV. In addition, aligning the major axis of each TSV within KOZ 410 in a column along a same axis 425 allows a reduction in the width of KOZ 410 when compared to a column of circular TSVs. Similarly, the major axis of each TSV within KOZ 415 is aligned in a column along a same axis 430, thereby allowing the width of KOZ 415 to be reduced. The width of each KOZ, e.g., KOZ 410, can be defined by the point along line 405 where the magnitude of stress, as indicated by arrows 460, falls to a predetermined level. The predetermined level can be one in which the effects of stress do not affect the operation of active devices or only affect operation of active devices in an acceptable manner. It should be appreciated that the KOZ size can be determined by moving from TSV 225 along line 405 in the direction of edge 445 and also in the direction of edge 450 until the magnitude of the force in each direction falls to the predetermined level. In cases where TSVs in a same column have differing diameter(s), it can be seen that the KOZ neighboring that column will have edges that are not straight, but rather are defined by each of the TSVs in that column.

The reduction in the width of each of KOZs 410 and 415 allows an increase in the width of active device area (area) 420 and, accordingly, the total area within area 420. Increasing the total area within area 420 allows a greater number of active devices and/or larger active devices to be located within area 420. Within interposer 400, in each KOZ, the major axis of each TSV within the KOZ is aligned along a same axis in a column. As a result, a width of each KOZ within interposer 400 can be narrower than a comparable column of conventional circular TSVs. Further, a width and, therefore, a total area of each active device zone within interposer 400 is greater than a comparable interposer implemented with columns of conventional circular TSVs.

It should be noted that although a same spacing is illustrated between columns of TSVs within interposer 400 in FIG. 4, the spacing between columns within interposer 400 can vary according to the spacing requirements for mounting one or more dies on interposer 400. Similarly, the spacing between TSVs in a column of TSVs need not be the same distance and can vary according to the packaging requirements for the multi-die IC in which interposer 400 is implemented. As such, the use of a common spacing between TSVs and a common spacing between columns of TSVs in FIG. 4 is for clarity of description and is not intended to limit the one or more embodiments disclosed within this specification.

To further illustrate the stress concentration occurring in the area of interposer 400 surrounding TSV 225, consider the set of opposing forces applied along edges 445 and 450 that result in a concentration of stress along axis 425. As the minor axis of elliptical TSV 225 is parallel to the opposing forces applied along edges 445 and 450, the stress concentration along axis 425 created by TSV 225 is greater than, and propagates farther away from TSV 225, than the stress concentration found with a circular TSV. Although the stress concentration created by elliptical TSV 225 along axis 425 is greater than the expected stress concentration for a circular TSV, no active devices are located within interposer 400 along axis 425 due the columnar arrangement of TSVs.

In addition, the increase in stress concentration along axis 425 created by elliptical TSV 225 is typically not significant enough to damage the material used to implement interposer 400. As such, the spacing between TSVs in a column of elliptical TSVs need not be any greater than the spacing between TSVs in a column of circular TSVs. As a result, the increase in stress concentration along axis 425 created by using elliptical TSVs does not significantly impact, if at all, the length and/or area required for a KOZ surrounding a column of elliptical TSVs when compared to a comparable column of circular TSVs.

Figure 5:
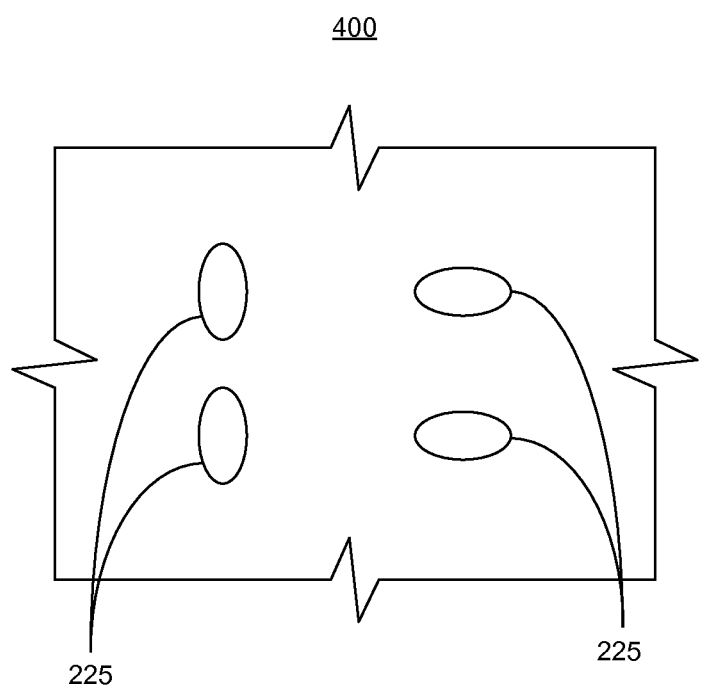
FIG. 5 is a fifth block diagram illustrating a topographic view of a portion of a multi-die silicon interposer in accordance with another embodiment disclosed within this specification.

In another embodiment, the orientation of each column of TSVs can differ, as pictured in FIG. 5. For example, active devices can neighbor each column residing along the edge of the KOZ for the column perpendicular to the conjugate diameter of the TSVs within the column. For example, when implementing a multi-die IC, each die of the IC may not be of a same size and/or require a same number of TSVs. In addition, it may be advantageous to mount dies upon an interposer in a manner that minimizes the routing distance of an inter-die signal shared between two or more dies of the multi-die IC. For this reason the spacing between dies, and/or the orientation of the dies, may not be common or uniform.

In that case, interposer 400 can be implemented with columns having differing numbers of TSVs, differing orientations, e.g., as pictured in FIG. 5, and/or differing spacing. In each case, by locating the major axis of each elliptical TSV within a column along a common axis, and locating the active devices neighboring each column adjacent to the edges of the KOZ for each column defined by the conjugate diameter of the TSVs within the column, the area available for the disposition of active devices within interposer 400 can be maximized.

In another embodiment, TSVs can be arranged in a combination of one or more columns and one or more rows. For example, TSVs within the column can be arranged as illustrated in FIG. 4. Each TSV within the one or more rows can be oriented so that the major axis of the TSV is perpendicular to the major axis of the TSVs within the columns, but still parallel or aligned with the major axis of each other TSV within the same row. Accordingly, the KOZ for the row of TSVs will be a row that is perpendicular to a KOZ such as KOZ 410. The KOZ(s) for the row(s) will intersect the KOZ(s) for the column(s).

The use of an elliptical TSV as described within this specification can decrease the propagation and concentration of stress in areas that neighbor the edge and that are aligned with the minor axis of the elliptical TSV. Used in this manner, a KOZ surrounding the elliptical TSV can be narrowed along the minor axis of the elliptical TSV. This narrowing of the KOZ allows active devices to be located closer to the elliptical TSV. Further, by aligning TSVs in columns, with a major axis of each TSV residing along a common axis within each column, an area required for a KOZ surrounding each column of TSVs can be minimized and the area available for active devices can be maximized.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit structure comprising:
   a first elliptical shaped through silicon via (TSV) within a silicon interposer, wherein a transverse diameter of the TSV exceeds a conjugate diameter of the TSV; and
   a second elliptical TSV within the silicon interposer, wherein an orientation of a major axis of the second elliptical TSV differs from an orientation of a major axis of the first elliptical TSV; wherein an active device is within the interposer.

2. The integrated circuit structure of claim 1, wherein the silicon interposer further comprises:
   a keep out zone (KOZ) surrounding the first elliptical TSV, wherein the KOZ is devoid of active devices and sized according to the transverse diameter and the conjugate diameter of the first elliptical TSV.

3. The integrated circuit structure of claim 1, wherein the silicon interposer further comprises a third elliptical TSV having a major axis aligned with a major axis of the first elliptical TSV.

4. The integrated circuit structure of claim 1, wherein a transverse diameter of the second elliptical TSV is larger than the transverse diameter of the first elliptical TSV.

5. The integrated circuit structure of claim 1, wherein a conjugate diameter of the second elliptical TSV is larger than the conjugate diameter of the first elliptical TSV.

6. The integrated circuit structure of claim 1, wherein the silicon interposer further comprises:
   a first plurality of elliptical TSVs comprising the first TSV aligned in a first column, wherein a major axis of each of the first plurality of elliptical TSVs is aligned with a first common axis; and
   a second plurality of elliptical TSVs aligned in a second column, wherein a major axis of each of the second plurality of elliptical TSVs is aligned with a second common axis,
   wherein the second column of elliptical TSVs is a predetermined distance from, and substantially parallel to, the first column of elliptical TSVs.

7. The integrated circuit structure of claim 6, wherein the silicon interposer further comprises at least one active device located between the first and the second columns of elliptical TSVs.

8. The integrated circuit structure of claim 7, wherein the at least one active device is located within a column that is a first predetermined distance from the first column of elliptical TSVs and a second predetermined distance from the second column of elliptical TSVs.

9. The integrated circuit structure of claim 7, wherein a keep out zone (KOZ) devoid of active devices surrounds each of the first and second columns of elliptical TSVs, and wherein a width of each KOZ for each of the first and second columns of elliptical TSVs is determined according to a conjugate diameter of at least one of the plurality of elliptical TSVs within each respective column of elliptical TSVs.

10. An integrated circuit (IC) structure comprising:
    a silicon interposer comprising a first plurality of elliptical through silicon vias (TSVs) aligned in a first column, and a second plurality of elliptical TSVs aligned in a second column,
    wherein, for each elliptical TSV, a transverse diameter of the TSV exceeds a conjugate diameter of the TSV,
    wherein a major axis of each of the first plurality of elliptical TSVs is aligned with a first common axis, and a major axis of each of the second plurality of elliptical TSVs is aligned with a second common axis, and
    wherein the second column of elliptical TSVs is a predetermined distance from, and substantially parallel to, the first column of elliptical TSVs; wherein an active device is within the interposer.

11. The IC structure of claim 10, wherein the silicon interposer further comprises at least one active device located between the first and the second columns of elliptical TSVs.

12. The IC structure of claim 11, wherein the at least one active device is located in a column of a predetermined width between the first and the second columns of elliptical TSVs.

13. The IC structure of claim 12, wherein a keep out zone (KOZ) devoid of active devices surrounds each of the first and second columns of elliptical TSVs, and wherein a width of the KOZ for each of the first and second columns of elliptical TSVs is determined according to the conjugate diameter of at least one plurality of elliptical TSVs within each respective column of elliptical TSVs.

14. The IC structure of claim 10, wherein the silicon interposer further comprises a first elliptical TSV of either the first or the second plurality of elliptical TSVs and a second elliptical TSV of either the first or the second plurality of elliptical TSVs, and wherein the transverse diameter of the second elliptical TSV is larger than the transverse diameter of the first elliptical TSV.

15. The IC structure of claim 10, wherein the silicon interposer further comprises a first elliptical TSV of either the first or the second plurality of elliptical TSVs and a second elliptical TSV of either the first or the second plurality of elliptical TSVs, and wherein the conjugate diameter of the second elliptical TSV is larger than the conjugate diameter of the first elliptical TSV.

16. The IC structure of claim 10, wherein the silicon interposer further comprises an elliptical TSV, not of the first or second plurality of elliptical TSVs, and wherein an orientation of a major axis of the elliptical TSV differs from an orientation of the first and second common axes.

17. The IC structure of claim 10, wherein the silicon interposer further comprises a third plurality of elliptical TSVs in a third column within the silicon interposer, wherein a major axis of each of the third plurality of elliptical TSVs is aligned with a third common axis, and wherein an orientation of third common axis differs from an orientation of the first or second common axes.

18. An integrated circuit structure comprising:
    an active silicon interposer comprising at least two elliptical shaped openings that transverse through the active silicon interposer from a first planar surface of the active silicon interposer to a second planar surface of the active silicon interposer substantially perpendicular to both planar surfaces;

a first conductive material within a first of the at least two elliptical shaped openings forming a conductive pathway extending from the first planar surface through to the second planar surface, wherein a transverse diameter of the first conductive material exceeds a conjugate diameter of the conductive material; and a second conductive material within a second of the at least two elliptical shaped openings forming a conductive pathway extending from the first planar surface through to the second planar surface, wherein a transverse diameter of the second conductive material exceeds a conjugate diameter of the conductive material; and wherein an orientation of a major axis of the first conductive material differs from an orientation of a major axis of the second conductive material; wherein an active device is within the interposer.

19. The IC structure of claim 18, wherein the active silicon interposer comprises:

a keep out zone (KOZ) surrounding the first conductive material, wherein the KOZ is devoid of active devices and sized according to the transverse diameter and the conjugate diameter of the first conductive material.

\* \* \* \* \*